(12) United States Patent
Jacobs

(10) Patent No.: US 6,880,038 B2
(45) Date of Patent: Apr. 12, 2005

(54) METHOD AND APPARATUS FOR PREDICTIVE FLASH MEMORY ERASE AND WRITE TIMES

(75) Inventor: Robert A. Jacobs, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/748,600

(22) Filed: Dec. 29, 2003

(65) Prior Publication Data

US 2004/0143698 A1 Jul. 22, 2004

Related U.S. Application Data

(63) Continuation of application No. 09/588,864, filed on Jun. 6, 2000, now Pat. No. 6,684,288.

(51) Int. Cl.[7] .............................................. G06F 12/00
(52) U.S. Cl. ....................................... 711/103; 711/156
(58) Field of Search ................................. 711/103, 167, 711/154; 365/185.33

(56) References Cited

U.S. PATENT DOCUMENTS 6,125,424 A 9/2000 Komatsu et al.
6,684,288 B1 * 1/2004 Jacobs ........................ 711/103

* cited by examiner

Primary Examiner—Matthew D. Anderson
(74) Attorney, Agent, or Firm—Marger Johnson & McCollom, PC

(57) ABSTRACT

A NOR-gate architecture memory with an erase and write time table. The memory processor creates an erase and write time table in a table block. The table contains the most recent times for erase and write operations for each data block in the memory. When a storage operation is initiated, the processor accesses the table and estimates the amount of time it will take to perform the data storage operation and then communicates that back to a host computer. Each data storage operation results in a new table being created that is written into the data block. To save erase and write operations for the table block, the new table is written directly after the most recent table unless there is not enough space. An erase and write operation is only performed on the table block if there is not enough space for the new table.

7 Claims, 2 Drawing Sheets

METHOD AND APPARATUS FOR PREDICTIVE FLASH MEMORY ERASE AND WRITE TIMES

This application is a continuation of prior U.S. Ser. No. 09/588,864 filed Jun. 6, 2000 now U.S. Pat. 6,684,288.

BACKGROUND OF THE INVENTION

1. Field

This invention relates to flash memory, more particularly to NOR flash memory with at least one block dedicated to storing erase and write times.

2. Background

Several different memory options exist today for system designers. The selection typically revolves around the desired characteristics of the memory, such as volatility, programmability and density. Volatile memory cannot retain its contents unless it has constant power. For this reason, some applications require non-volatile memory, such as read-only memory (ROM).

Some applications capitalize on the fact that typical ROMs have only limited programmability. Examples of ROM memory include electrically programmed ROM (EPROM) which can only be erased with ultraviolet light, or electrically erasable programmable ROM (EEPROM), which is byte-erasable. For original equipment manufacturers that do not want consumers to be able to erase these memories, but want the ability to upgrade it, these types of memories are ideal.

Both ROM and RAM are high density, being able to store high amounts of data in relatively small space. However, both typically consume lots of power. A solution for low-power, high-density, easily programmable non-volatile memory is flash memory. Flash memory is ideal for portable devices that require some type of storage.

Two different architectures of flash memory are the more prevalent options on the market today, one based upon the use of NOR gates (NOR flash), the other on NAND gates (NAND flash). Each has advantages and disadvantages.

For example, NOR flash is more suitable for program storage. Unfortunately, NOR flash takes longer to write, because the existing data must first be erased and then the new data written. The perception seems to be that the erase and write times given on NOR flash data sheets are too slow for data storage. However, these parameters are based upon a high number of cycles, which has degraded performance for erasures and writes. It is believed that data storage applications would write to flash fewer times, allowing for performance faster than the data sheet applications.

It is believed that if the user could track the progress, the faster progress would be noted and greater acceptance of NOR flash would result. Therefore, a need exists for a method and apparatus capable of tracking the erase and write times for NOR flash memory.

BRIEF DESCRIPTION OF THE DRAWINGS

The invention may be best understood by reading the disclosure with reference to the drawings, wherein.

DETAILED DESCRIPTION OF THE PREFERRED EMBODIMENTS

Figure 1:
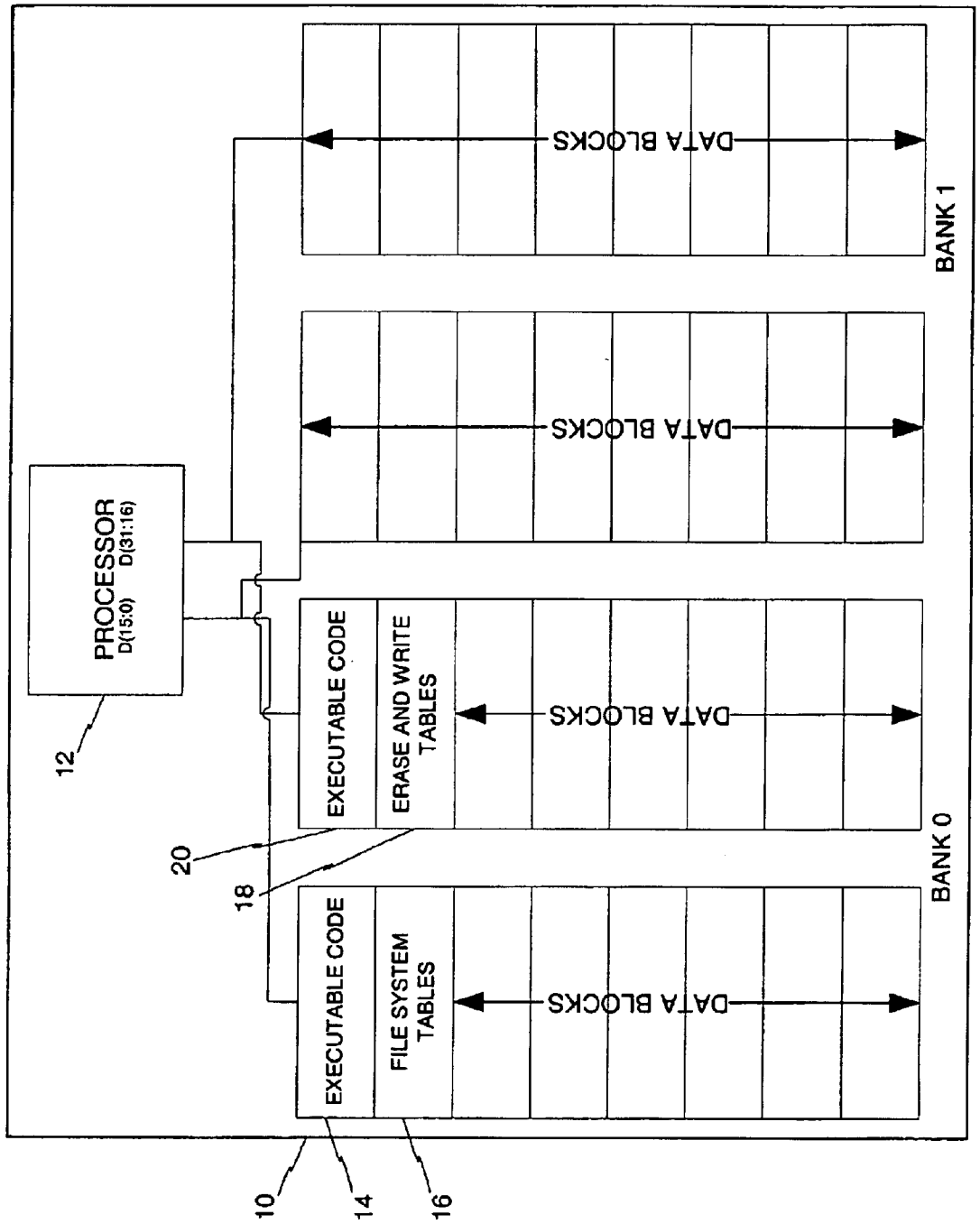
FIG. 1 shows one embodiment of a NOR flash memory architecture with an erase and write timetable in accordance with the invention.

One embodiment of an architecture of a NOR flash memory is shown in FIG. 1. The memory 10 has at least one bank of memory; each divided up into at least two data blocks. In the example of FIG. 1, there are two banks of memory, Bank 0 and Bank 1. This particular architecture is merely an example and is not intended of limited applicability of the invention. Each bank has several data blocks organized. As shown in FIG. 1, each bank contains data blocks 0–31. Bank 0 has specialty blocks used for both banks of data blocks. These blocks are dedicated for non-data storage.

In the example of FIG. 1, Bank 0 has executable code in the first block 14. In addition, the second block 16 contains the file system tables, which tell the processor 12 which blocks are available and which blocks are storing which data. In one example of a flash memory in accordance with the invention, a second table may be located in block 18. This table, wherever located, may contain the erase and write tables for all the data blocks in the memory.

Similar to the file system tables, the erase and write tables may hold information for all of the data blocks. It may be contained in another dedicated, non-storage, data block, referred to here as the table block. The information on erase and write times applies to all of the data blocks, not just the bank in which the table is located. It must be noted that the example of FIG. 1 is in no way intended to limit applicability of the invention. Any memory that tracks and stores the erase and write times of the data blocks would be in accordance with the invention.

The memory is operated such that the erase and write times of each data block are tracked and stored. This information is then used when the memory is accessed for storage. For ease of discussion, the operation of this memory will be divided into two discussions. The first discussion focuses on the management and maintenance of the table. The second discussion focuses on the accessing and estimating of the erase and write time. Both of these processes may be part of one large process, and may run simultaneously at least in part, or separately.

Figure 2:
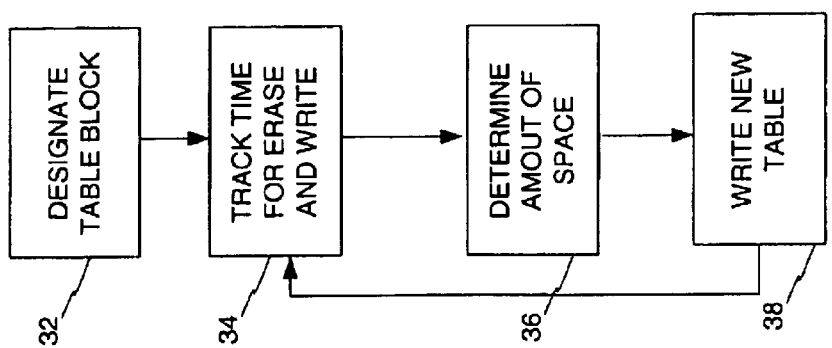
FIG. 2 shows a flowchart for one embodiment of a method for managing an erase and write time table in accordance with the invention.

FIG. 2 shows one embodiment of a method for managing the NOR-gate architecture flash memory. The erase and write table may be located anywhere, but it must be designated in some memory block at 32. Once the processor knows where the erase and write table is located, it then begins to provide data to populate the table. The table itself is structured to provide information indexed by data block number. The information includes the time it took for the last erase and the time it took for the last write. It may also include the number of erasures for each block.

When data is committed to the flash memory, the erase and write time for each block is tracked at 34 and a new erase and write memory is created. The new erase and write entry will be written into the designated table block. In order to save erase and write cycles on the table block, the new entry will typically be written at the end of the most recent entry prior to the current one.

However, the possibility exists that there is not enough space in the table block to allow the new entry to be located after of the most recent entry. Therefore, it is necessary to determine the amount of available space in the table block at 36.

If the table block has the space, the new entry is written after the most recent entry. If the table block does not have sufficient space, the table block must be erased and a new entry will be written at the beginning of the table block space, with the entry being the new data for that block and the previous data for the other blocks. In either case, the new entry is written at 38.

Once the table block is designated for a flash memory, the processor will continue to track the erase and write times. It will then update the table, determine the amount of space for writing entries and then write the entry in the appropriate manner for the space available.

As the entries are written, they are each given a unique header. The header allows the processor firmware to locate the most recent entries for each block at initialization of the memory. The header will also contain the total number of bytes and storage time for the last operation. When a new entry is made for a data block, the previous entry for that block is marked invalid.

Figure 3:
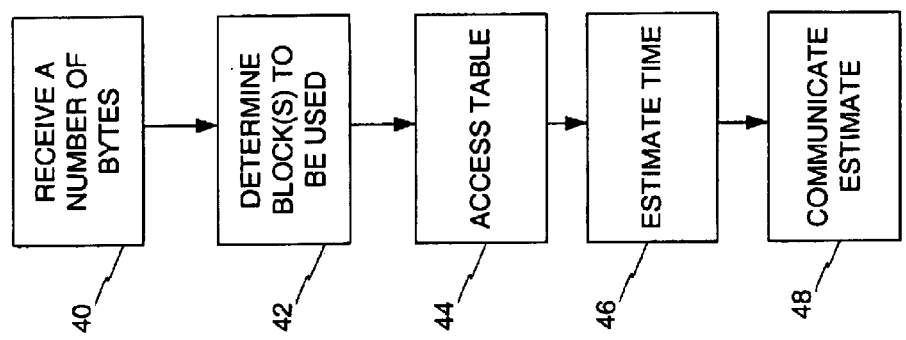
FIG. 3 shows a flowchart for one embodiment of a method for presenting estimates of erase and write time for flash memory in accordance with the invention.

An embodiment of a method for performing storage of the bytes of data is shown in FIG. 3. At 40, the processor receives a request to access the flash memory for data storage. The request includes the number of bytes of data to be stored. The data storage operation is then initiated. The processor 10 as shown in FIG. 1 is a system processor external to the flash memory. It may also be an on-board processor that resides with the memory.

The processor then accesses the file system tables to determine which blocks are available and ultimately which blocks it will use at 42. It then accesses the erase and write table at 44 to determine the last erase and write times for each of the blocks to be used. These times are then summed and the sum used as an estimate of the total time it will take to store the number of bytes 46. This estimate is communicated to other processes in the device or an external host computer to allow the user to receive the estimate at 48.

The process of estimating and communicating the estimate can be performed iteratively. This would be useful in the case of a progress bar or percentage being presented by the host computer to the user. As the blocks are filled, the memory processor may then adjust the estimate and communicate the updated time to the host computer. Alternatively, the device may just use the estimate given from the memory and generate the appropriate information for the user display from the estimate.

It must be noted that the term host computer refers to any device that may send a storage request to the flash memory, including other processes running on the system processor. The host computer may be a system processor in a personal computer that is going to store data in a flash memory located with the system processor on a printed circuit board, for example. The host computer may be a processor for a dedicated Internet device, such as an Internet radio receiver or an electronic book. The host computer may be external to the flash memory, where the host computer connects to the flash memory only for storage and then disconnects from it. No limitation on the host computer is intended by any of the above examples.

In addition to the presentation of the erase and write time estimates for storage to users, the ability to predict erase and write times based on actual erase and write times may be useful in other areas. Some systems may use storage devices with variable programming performance. In such a system there may be a need to predict or present expected storage time for the next programming operation. In this instance, memory architectures with predictive erase and write times that are more exact would be useful.

Thus, although there has been described to this point a particular embodiment for a method and structure for a NOR-gate architecture flash memory with erase and write time tables, it is not intended that such specific references be considered as limitations upon the scope of this invention except in-so-far as set forth in the following claims.

What is claimed is:

1. A memory system, comprising:
   a processor; and
   a memory bank having data blocks, comprising:
      a system table accessible by the processor to store data about the data blocks; and
      at least one erase and write table accessible by the processor to store erase and write time data for the data blocks.

2. The memory system of claim 1 wherein the erase and write table also stores data about a total number of bytes for each storage operation.

3. The memory system of claim 1 wherein the table also stores number of erasures for each data block.

4. The memory system of claim 1, wherein the system table is stored in a data block.

5. The memory system of claim 1, wherein the erase and write table is stored in a data block.

6. The memory system of claim 1, wherein the data blocks are organized into data banks and the system table and the erase and write table are in the same data bank.

7. The system of claim 1, wherein the data blocks are organized into data banks and the system table and the erase and write table are in different data banks.

* * * * *